United States Patent
Cheng et al.

(10) Patent No.: US 11,152,307 B2
(45) Date of Patent: Oct. 19, 2021

(54) BURIED LOCAL INTERCONNECT

(71) Applicant: INTERNATIONAL BUSINESS MACHINES CORPORATION, Armonk, NY (US)

(72) Inventors: Kangguo Cheng, Schenectady, NY (US); Lawrence A. Clevenger, Saratoga Springs, NY (US); Carl Radens, LaGrangeville, NY (US); Junli Wang, Slingerlands, NY (US); John H. Zhang, Altamont, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 148 days.

(21) Appl. No.: 16/223,832

(22) Filed: Dec. 18, 2018

(65) Prior Publication Data
US 2020/0194372 A1    Jun. 18, 2020

(51) Int. Cl.
| H01L 23/535 | (2006.01) |
| H01L 29/786 | (2006.01) |
| H01L 21/8238 | (2006.01) |
| H01L 27/12 | (2006.01) |
| H01L 27/11 | (2006.01) |

(52) U.S. Cl.
CPC .... H01L 23/535 (2013.01); H01L 21/823871 (2013.01); H01L 27/1108 (2013.01); H01L 27/1203 (2013.01); H01L 29/78642 (2013.01)

(58) Field of Classification Search
CPC .............. H01L 23/535; H01L 27/1108; H01L 29/78642; H01L 21/823871
See application file for complete search history.

(56) References Cited

U.S. PATENT DOCUMENTS

| 6,660,590 B2 | 12/2003 | Yoo |
| 6,759,699 B1 | 7/2004 | Chi |
| 6,846,709 B1 | 1/2005 | Lojek |
| 7,033,877 B2 | 4/2006 | Chaudhry et al. |
| 7,138,685 B2 | 11/2006 | Hsu et al. |
| 9,245,885 B1 | 1/2016 | Xie et al. |
| 9,373,641 B2 | 6/2016 | Anderson et al. |
| 9,620,509 B1 | 4/2017 | Pao et al. |
| 9,680,473 B1 | 6/2017 | Anderson et al. |
| 9,825,032 B1* | 11/2017 | Bentley ............... H01L 27/092 |
| 9,831,317 B1* | 11/2017 | Zang .................... H01L 27/092 |
| 2010/0219483 A1* | 9/2010 | Masuoka ............ H01L 27/1104 |
| | | 257/369 |
| 2011/0018056 A1* | 1/2011 | Takeuchi .............. H01L 23/535 |
| | | 257/329 |
| 2011/0156107 A1* | 6/2011 | Bohr ................. H01L 21/76849 |
| | | 257/288 |

* cited by examiner

Primary Examiner — Tuan A Hoang
(74) Attorney, Agent, or Firm — Cantor Colburn LLP; Joseph Petrokaitis

(57) ABSTRACT

A semiconductor structure includes a plurality of field effect transistors formed on a substrate including p-type doped field effect transistors (pFETs) and n-type doped field effect transistors (nFETs). A self-aligned buried local interconnect electrically connects a bottom source or drain region of the pFET with an adjacent bottom source or drain region of the nFET. The self-aligned buried local interconnect is serially aligned with and intermediate opposing ends of a gate electrode. Other embodiments include methods for forming the buried local interconnect.

13 Claims, 9 Drawing Sheets

BURIED LOCAL INTERCONNECT

BACKGROUND

The present invention relates in general to semiconductor device structures and their fabrication. More specifically, the present invention relates to the structure and fabrication of self-aligned buried local interconnects.

Modern integrated circuits routinely contain millions of individual transistors and other electronic components. Most of the interconnections for the numerous components in such circuits are provided via one or more metallization layers that serve as global interconnect levels. Each metallization layer is ordinarily deposited on the substrate of the integrated circuit as a single continuous layer that is thereafter patterned lithographically and etched to remove metal from areas where metal lines are not required.

In addition to the one or more metallization layers, modern integrated circuits also incorporate numerous routing restricted interconnect levels commonly known as local interconnects. Local interconnects are used for short conductor runs such as those that locally interconnect gates and drains in NMOS and CMOS circuits and those that connect a given metallization layer to a particular structure in the integrated circuit.

SUMMARY

Embodiments of the present invention are generally directed to semiconductor structures including a buried local interconnect and methods of fabrication. A non-limiting example of a semiconductor structure according to aspects of the invention includes a plurality of field effect transistors formed on a substrate including p-type doped field effect transistors (pFETs) and n-type doped field effect transistors (nFETs). A self-aligned buried local interconnect electrically connects a bottom source or drain region of the pFET with an adjacent bottom source or drain region of the nFET. The self-aligned buried local interconnect is serially aligned with and intermediate opposing ends of a gate electrode.

A non-limiting example of a method of forming a buried local interconnect electrically connecting a p-type doped field effect transistor (pFET) to an n-type doped field effect transistor (nFET) according to aspects of the invention includes providing an initial structure on a substrate including a vertically oriented fin coupled to a n-type doped bottom source or drain (S/D) electrically isolated from a vertically oriented fin coupled to a p-type doped bottom S/D. Each of the vertically oriented fins include a hardmask on a top surface thereof, a high k dielectric layer on sidewalls of each fin and a gate electrode adjacent the vertically oriented fins. A first block mask is deposited onto the initial structure. The first block mask and the gate electrode are lithographically patterned and etched to a bottom spacer layer to cut the gate electrode and form a first opening therein. A spacer layer is selectively deposited on sidewalls of the gate electrode defining the first opening. A second block mask is deposited and lithographically patterned and etched through the bottom spacer layer to form a second opening at the cut gate electrode exposing the n-typed doped bottom S/D and an adjacent p-type doped bottom S/D. A metal liner and a metal are deposited into the second opening and on the exposed n-type doped bottom S/D and the adjacent p-type doped bottom S/D. The metal liner and the metal are recessed to a target thickness. The second block mask is stripped and an oxide is deposited to fill the second opening such that the oxide has a coplanar top surface to form the self-aligned buried local interconnect electrically coupling the n-typed doped bottom S/D and the adjacent p-type doped bottom S/D.

A non-limiting example of a method of forming a buried local interconnect electrically connecting a p-type doped field effect transistor (pFET) to an n-type doped field effect transistor (nFET) according to aspects of the invention includes forming multiple semiconductor bodies separated by isolation regions comprising at least a first semiconductor body for a first field effect transistor and a second semiconductor body for a second field effect transistor. An elongated gate electrode is formed that traverses the multiple semiconductor bodies. An opening is formed in the elongated gate electrode between the first semiconductor body and the second semiconductor body to define a first segment of the gate electrode and a second segment of the gate electrode. A buried metal interconnect is formed between the first semiconductor body and the second interconnect body, wherein the buried metal interconnect electrically couples the first field effect transistor to the second field effect transistor.

Additional features are realized through the techniques of the present invention. Other embodiments are described in detail herein and are considered a part of the claimed invention. For a better understanding of the invention with the features, refer to the description and to the drawings.

BRIEF DESCRIPTION OF THE DRAWINGS

The subject matter which is regarded as the invention is particularly pointed out and distinctly claimed in the claims at the conclusion of the specification. The forgoing features are apparent from the following detailed description taken in conjunction with the accompanying drawings in which:

DETAILED DESCRIPTION

Figure 1:
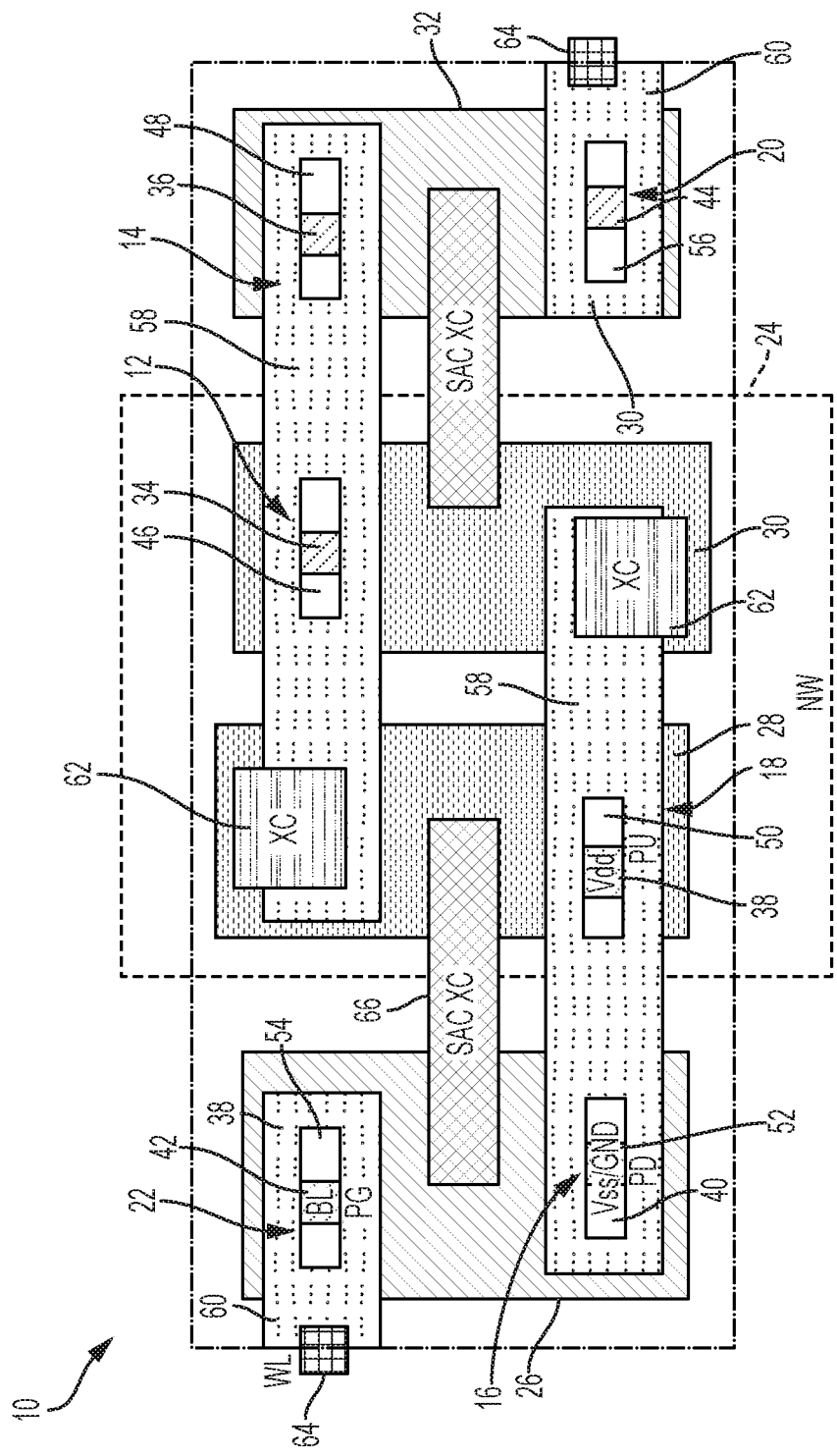
FIG. 1 depicts a top down view of a prior art 6T SRAM structure.

In contemporary semiconductor device fabrication processes, a large number of semiconductor devices, such as field effect transistors (FETs), are fabricated on a single wafer. Some non-planar transistor device architectures, such as vertical field effect transistors (VFETs), employ semiconductor fins and side-gates that can be contacted outside the active region, resulting in increased device density and performance over lateral devices. VFETs are one of the promising alternatives to standard lateral FET structures due to benefits, among others, in terms of reduced circuit footprint. In this type of structure, the current flow is perpendicular to a supporting wafer, unlike the lateral current flow in fin-type FETs (FinFETs).

In general, as a result of the reduced dimensions of the transistor devices, the operating speed of the circuit components has been increased with every new device generation, and the "packing density," i.e., the number of transistor devices per unit area, in such products has also increased during that time. Such improvements in the performance of transistor devices has reached the point where one limiting factor relating to the operating speed of the final integrated circuit product is no longer the individual transistor element but the electrical performance of the complex wiring system that is formed above the device level that includes the actual semiconductor-based circuit elements.

Typically, due to the large number of circuit elements and the required complex layout of modern integrated circuits, first and second metal layers are used to make electrical contact between certain regions of the wafer. This significantly limits density scaling since, with fin type field effect transistors (FinFETs), density limits are constrained by middle-of-line (MOL) wiring density, and not by active fin density. Specifically, the first and second metallization layers seriously limit the density of integrated circuits.

In aspects of the present invention, structures and fabrication processes are provided for maximizing circuit density while forming a buried local interconnect between semiconductor-based elements on different spaced-apart active regions that are electrically isolated from one another.

It is understood in advance that although a detailed description of an exemplary FinFET configuration having a certain configuration is presented herein, implementation of the teachings recited herein are not limited to any particular FinFET structure described herein. Rather, embodiments of the present invention are capable of being implemented in conjunction with any other type of fin-based transistor device now known or later developed.

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

As used herein, the terms "invention" or "present invention" are non-limiting terms and not intended to refer to any single aspect of the particular invention but encompass all possible aspects as described in the specification and the claims.

Described herein is a method of making a semiconductor structure with the use of a nitride that is selectively grown on a conductor. Previous methods had difficulty growing equal spacers on n-type FET (NFET) and p-type FET (PFET). Conventional methods have different dimensions of spacers for n-type FET and p-type FET. In general, it is preferable to have equal dimensions such that the gate capacitances of n-type FET and p-type FET are the same for circuit design. In addition, the height of the gate might be different for n-type FET and p-type FET. When performing a chemical mechanical polish on the POC liner, if the gate heights are uneven, then an overpolish can be the result, resulting in non-uniformity in the width of the gate. N-type FETs and p-type FETs with different characteristics can be problematic. To get around these difficulties, one had to resort to multiple patterning or a significant process flow change, which adds to the cost and time in creating semiconductor devices. Embodiments described herein avoid such problems through the use of a nitride grown on a conductor instead of growing a nitride on a poly-open chemical mechanical polish (POC) liner.

FIG. 1 shows a layout of a typical six transistor (6T) SRAM cell 10 of the prior art. The illustrated SRAM cell is made up of six VFETs 12, 14, 16, 18, 20, and 22 formed on a p-type substrate including an N-well 24 and buried source/drain node plates 26, 28, 30 and 32. Each bit in an SRAM is stored on four VFET transistors (12, 14, 16, 18) that form two cross-coupled inverters. This storage cell has two stable states which are used to denote 0 and 1. The two additional access transistors 20, 22 serve to control the access to a storage cell during read and write operations.

As shown, each VFET 12, 14, 16, 18, 20, and 22 includes a top source or drain "source/drain" 34, 36, 38, 40, 42, 44, and a channel 46, 48, 50, 52, 54, 56, respectively. VFETs 12 and 18 are p-type doped VFETs, i.e., PFETs, and VFETs 14,16, 20, 22, are n-type doped VFETs, i.e., NFETs. Gate electrodes 58, 60 are transverse to the buried source/drain node plates and overlay one or more of the transistors as is known in the art. The SRAM cell 10 further includes self-aligned contacts 62 and gate contacts 64. Self-aligned buried local interconnects 66 are intermediate adjacent gate electrodes 58 and electrically connect the n-type doped VFETS with the p-type doped PFETS via the source/drain node plates, e.g., between source/drain node plate 26 and source drain node plate 28 or between source/drain node plate 30 and source drain node plate 32.

Figure 2:
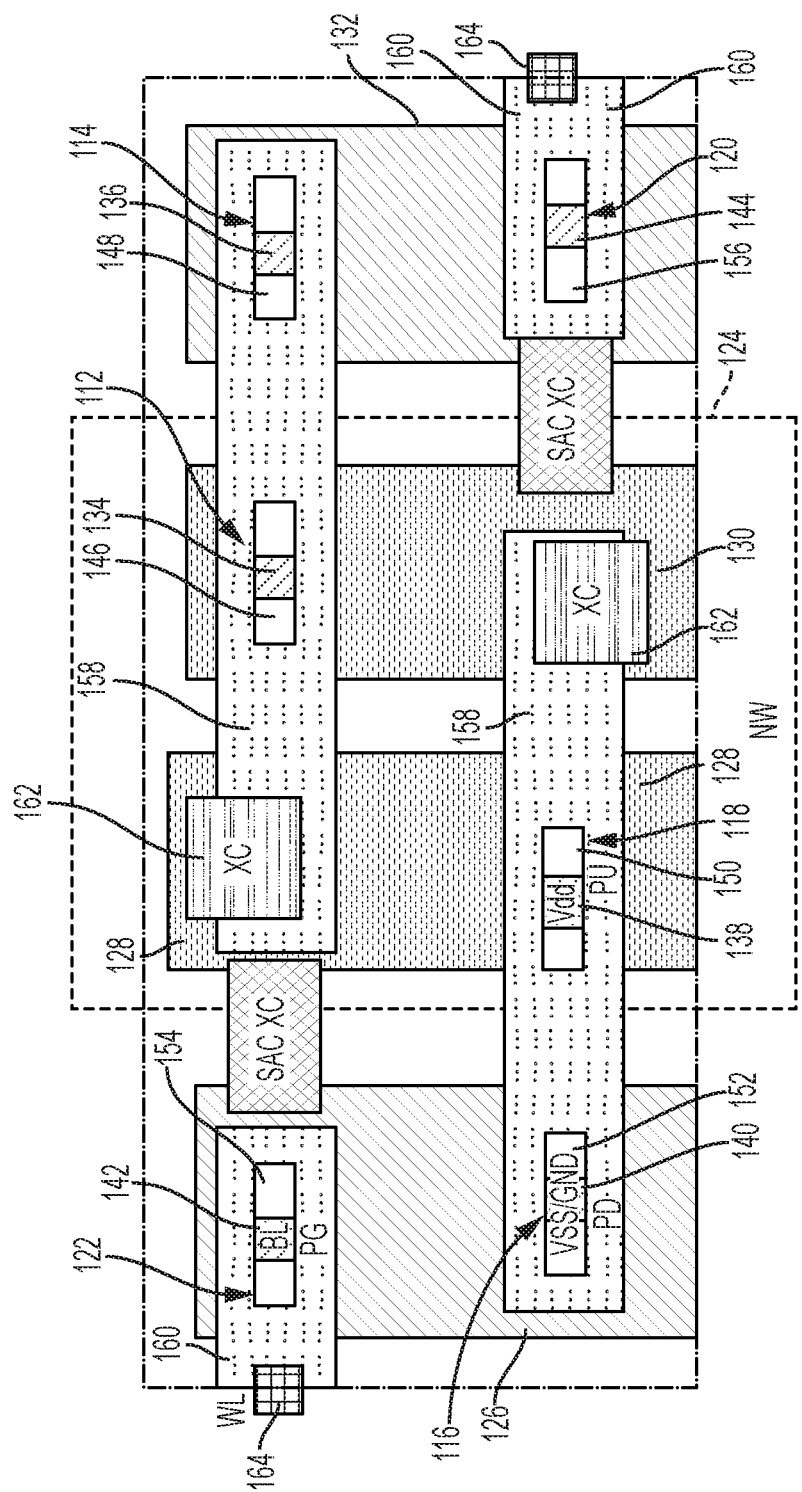
FIG. 2 depicts a top down view of a 6T SRAM structure according to one or more embodiments of the present invention.

FIG. 2 shows a layout of a 6T SRAM cell 100 in accordance with one or more embodiments of the present invention. The illustrated SRAM cell is made up of six VFETs 112, 114, 116, 118, 120, and 122 formed on a p-type substrate including an N-well 124 and buried source/drain node plates 126, 128 130 and 132. VFETs 112 and 118 are PFETs and VFETs 114, 116, 120, and 122 are NFETs. Each bit in an SRAM is stored on four VFET transistors (112, 114, 116, 118) that form two cross-coupled inverters. This storage cell has two stable states which are used to denote 0 and 1. The two additional access transistors 120, 122 serve to control the access to a storage cell during read and write operations.

As shown, each VFET 112, 114, 116, 118, 120, 122, 124, and 126 includes a top source/drain 134, 136, 138, 140, 142, 144 and a channel 146, 148, 150, 152 154, and 156, respectively. Gate electrodes 158, 160 are transverse to the buried source/drain node plates and overlay one or more of the transistors. The SRAM cell 10 further includes self-aligned contacts 162 and gate contacts 164. Self-aligned buried local interconnects 166 are provided subsequent to a gate cut process applied to gates 158 after final formation of the gates 158, 160 so as to maximize density and electrically connect an NFET and a PFET e.g., between source/drain node plate 126 and source drain node plate 124 or between source/drain node plate 128 and source drain node plate 132.

Figure 3:
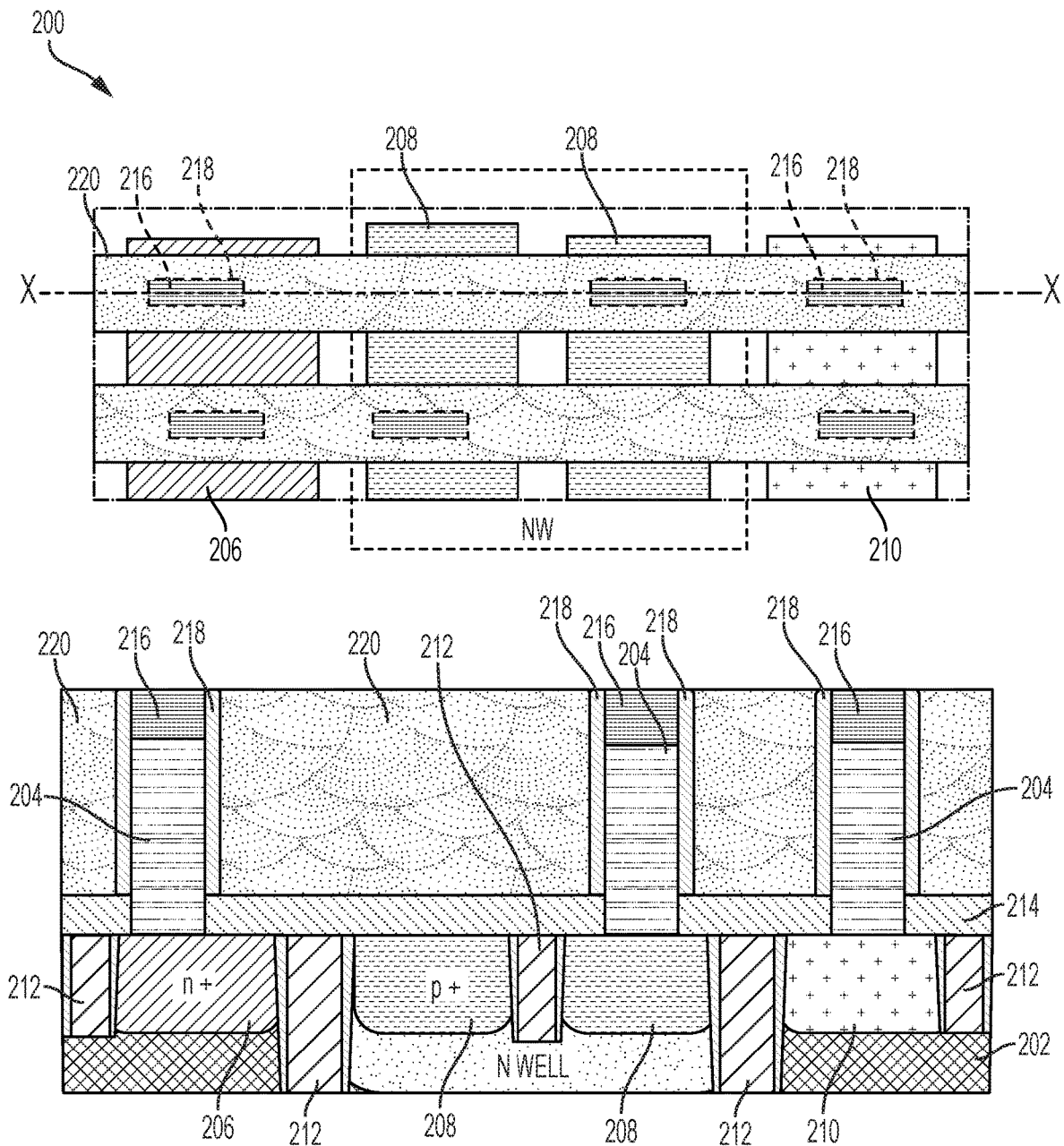
FIG. 3 shows a top down view and a cross sectional view of a semiconductor structure taken along lines X-X of the top down after gate (or final gate electrode) formation view in accordance with one or more embodiments of the present invention.

FIG. 3 shows a top down view and a cross sectional view of a semiconductor structure 200 taken along lines X-X of the top down view at a starting point for one or more embodiments of the present invention, which is after dummy gate (or final gate electrode) formation. The initial structure 200 can be formed on a semiconductor substrate 202 and generally includes one or more vertically oriented fins 204. The initial structure 200 further includes bottom source or drain regions (S/D) 206, 208, 210, which can be used to define whether the field effect transistor is a p-type doped field effect transistors (pFET) or n-type doped field effect transistors (nFET) regions. As illustrated, bottom S/D 206, 210 are p-typed doped and bottom S/D 208 is n-type doped. To form the doped regions, a bottom epitaxy layer can be epitaxial grown and/or deposited onto the substrate and subsequently be in-situ doped to provide the desired doping, e.g., n-type doped semiconductor or a p-type doped semiconductor. By way of example, epitaxially grown silicon can be doped with an n-type dopant (e.g., phosphorus or arsenic) to form a bottom source or drain region 208 for the nFET or with a p-type dopant (e.g., boron or gallium) to form the bottom source or drain region 206, 210 for the pFET. Shallow trench isolation regions 212 formed of an insulating material such as an oxide can be used to separate the different doped regions, i.e., the pFETs and the nFETs are located on separate semiconductor bodies.

A bottom spacer layer 214 is provided on the substrate 202 between the vertically oriented fin structures 210 and overlying the doped regions 206, 208, 210. The bottom spacer layer 214 can be deposited by any non-conformal deposition methods that provides a faster deposition rate on the planar surface and slower deposition rate on the sidewall surface including but not limited to plasma vapor deposition (PVD), high density plasma (HDP) deposition or the like. After directional deposition of bottom spacer, an etch-back process is performed to remove the any residue of spacer materials from the fin sidewall. In PVD, a pure source material is gasified via evaporation, the application of high power electricity, laser ablation, or the like. The gasified material will then condense on the substrate material to create the desired layer. In one or more embodiments, the bottom spacer 214 can be a low k dielectric material. The term "low k dielectric" generally refers to an insulating material having a dielectric constant less than silicon nitride, i.e., less than 7.0. Exemplary low k dielectric materials include, but are not limited to, dielectric nitrides (e.g., silicon nitride, SiBCN), dielectric oxynitrides (e.g., SiOCN), or any combination thereof or the like. In one or more embodiments, the spacer 20 can have a thickness in the range of about 3 nm to about 10 nm, or in the range of about 4 nm to about 6 nm.

The fins 204, one of which is shown for each of the pFET regions 206, 210, and nFET region 208 extends vertically relative to the substrate 202. Stated differently, the fin 204 is normal to or perpendicular to the substrate 202 including a portion having a shape of a rectangular parallelepiped. The fins 204 subsequent to patterning include a hardmask 216 on a top surface thereof. Any patterning technique can be used to form the fins as is known in the art including sidewall imaging transfer processes. The etching to form the fins 204 can include a dry etching process such as, for example, reactive ion etching, plasma etching, ion etching, or laser ablation. The fins 204 in the different nFET and pFET regions can be both formed of crystalline silicon.

The direction along which a semiconductor fin 204 laterally extends the most is herein referred to as a "lengthwise direction" of the fin. The height of each semiconductor fin 210 can be in a range from about 5 nm to about 300 nm, although lesser and greater heights can also be employed. The width of each semiconductor fin 204 can be in a range from about 5 nm to about 100 nm, although lesser and greater widths can also be employed. In various embodiments, the fins 204 can have a width in the range of about 4 nm to about 20 nm, or can have a width in the range of about 5 nm to about 15 nm, or in the range of about 6 nm to about 8 nm. In various embodiments, the fin 210 can have a height in the range of about 25 nm to about 75 nm, or in the range of about 40 nm to about 50 nm. The channel length, i.e., length of the fin 204 in the vertical direction from the substrate 202, in the pFET region 206, 210 and the nFET regions 208 are equal to one another. It should be apparent that embodiments of the present invention are not limited to this particular structure and the semiconductor structure can include other devices formed thereon. Moreover, the initial structure 200 is not intended to be limited to any particular method for forming the structure 200 up to formation of the gate electrode 220.

The hardmask 216 can include, for example, a silicon nitride (SiN) hardmask. The hardmask 20 can be deposited using a deposition process, including, but not limited to, PVD, CVD, PECVD, or any combination thereof. Other hard mask compositions can include silicon oxides, silicon oxynitrides, silicon carbides, silicon carbonitrides, etc. Spin-on dielectrics can also be utilized as a hard mask material including, but not limited to, silsequioxanes, siloxanes, and boron phosphate silicate glass (BPSG) or the like. The hardmask 216 can be formed of a single material or multiple materials.

The one or more vertically oriented fins 204 include sidewall spacers 218 formed of a dielectric material. The gate dielectric can include any suitable dielectric material, including but not limited to silicon oxide, silicon nitride, silicon oxynitride, high-k materials, or any combination of these materials. Examples of high-k materials include but are not limited to metal oxides such as hafnium oxide, hafnium silicon oxide, hafnium silicon oxynitride, lanthanum oxide, lanthanum aluminum oxide, zirconium oxide, zirconium silicon oxide, zirconium silicon oxynitride, tantalum oxide, titanium oxide, barium strontium titanium oxide, barium titanium oxide, strontium titanium oxide, yttrium oxide, aluminum oxide, lead scandium tantalum oxide, and lead zinc niobate. The high-k can further include dopants such as lanthanum, aluminum, magnesium. The gate dielectric material can be formed by any suitable process or any suitable combination of multiple processes, including but not limited to, thermal oxidation, chemical oxidation, thermal nitridation, plasma oxidation, plasma nitridation, atomic layer deposition (ALD), chemical vapor deposition (CVD), etc. In one or more embodiments, the gate dielectric has a thickness ranging from 1 nm to 5 nm, although less thickness and greater thickness are also conceived.

The initial structure 200 further includes a gate electrode 220 adjacent the fins, which can include any suitable conducting material, including but not limited to, doped polycrystalline or amorphous silicon, germanium, silicon germanium, a metal (e.g., tungsten (W), titanium (Ti), tantalum (Ta), ruthenium (Ru), hafnium (Hf), zirconium (Zr), cobalt (Co), nickel (Ni), copper (Cu), aluminum (Al), platinum (Pt), tin (Sn), silver (Ag), gold (Au), a conducting metallic compound material (e.g., tantalum nitride (TaN), titanium nitride (TiN), tantalum carbide (TaC), titanium carbide (TiC), titanium aluminum carbide (TiAlC), tungsten silicide (WSi), tungsten nitride (WN), ruthenium oxide ($RuO_2$), cobalt silicide (CoSi), nickel silicide (NiSi)), transition metal aluminides (e.g. Ti3Al, ZrAl), TaC, TaMgC, carbon nanotube, conductive carbon, graphene, or any suitable combination of these materials. The conductive material can further include dopants that are incorporated during or after deposition. In some embodiments, the gate can further include a work function setting layer between the gate dielectric and gate conductor. The work function setting layer can be a work function metal (WFM). WFM can be any suitable material, including but not limited a nitride, including but not limited to titanium nitride (TiN), titanium aluminum nitride (TiAlN), hafnium nitride (HfN), hafnium silicon nitride (HfSiN), tantalum nitride (TaN), tantalum silicon nitride (TaSiN), tungsten nitride (WN), molybdenum nitride (MoN), niobium nitride (NbN); a carbide, including but not limited to titanium carbide (TiC) titanium aluminum carbide (TiAlC), tantalum carbide (TaC), hafnium carbide (HfC), and combinations thereof. In some embodiments, a conductive material or a combination of multiple conductive materials can serve as both gate conductor and WFM. The gate conductor and WFM can be formed by any suitable process or any suitable combination of multiple processes, including but not limited to, atomic layer deposition (ALD), chemical vapor deposition (CVD), physical vapor deposition (PVD), sputtering, plating, evaporation, ion beam deposition, electron beam deposition, laser assisted deposition, chemical solution deposition, etc.

The gate electrode 220 as shown in the initial structure extends over multiple fins, which will define the channels, of the respective nFETs and pFETs.

In the case of a dummy gate, the dummy gate is formed adjacent to the fins 204 on the bottom spacer layer 214. The dummy gate material 112 can be, for example, amorphous silicon layer or polysilicon. The dummy gate material can be formed by deposition of the desired silicon material, planarization using a suitable process such as, for example, chemical mechanical polishing (CMP), gate lithography, and reactive ion etching (ME) to define the dummy gate. Dummy gate can have a single material (e.g. amorphous carbon) or multiple materials (e.g., a dummy oxide liner between dummy amorphous silicon gate and fins).

As used herein, the term "substrate" can be any suitable substrate material, such as, for example, any semiconductor material including, but not limited to, silicon. In one or more embodiments and when substrate 202 is a remaining semiconductor material portion of a bulk semiconductor substrate, the substrate 202 be of a single crystalline semiconductor material, such as, for example, single crystalline silicon. In some embodiments, the crystal orientation of the remaining semiconductor portion of the bulk semiconductor substrate can be {100}, {110}, {111} or any other of the well-known crystallographic orientations. As will be described in greater detail below, each semiconductor fin 204 can include the same semiconductor material, or a different semiconductor material, from substrate 202.

In another embodiment, substrate 202 includes at least an insulator layer of a semiconductor-on-insulator (SOI) substrate (not specifically shown). Although not specifically shown, one skilled in the art understands that an SOI substrate includes a handle substrate, an insulator layer located on an upper surface of the handle substrate, and a semiconductor layer located on an uppermost surface of the insulator layer. The handle substrate provides mechanical support for the insulator layer and the semiconductor layer. The semiconductor layer of such an SOI substrate can be processed into semiconductor fins.

The handle substrate and the semiconductor layer of the SOI substrate can include the same, or different, semiconductor material. The term "semiconductor" as used herein in connection with the semiconductor material of the handle substrate and the semiconductor layer denotes any semiconductor material including, for example, Si, Ge, SiGe, SiC, SiGeC, II/VI, and III/V compound semiconductors such as, for example, InAs, GaAs, or InP. Multilayers of these semiconductor materials can also be used as the semiconductor material of the handle substrate and the semiconductor layer. In one or more embodiments, the handle substrate and the semiconductor layer are both formed of silicon. In some embodiments, the handle substrate is a non-semiconductor material including, for example, a dielectric material and/or a conductive material. In yet other embodiments, the handle substrate can be omitted and the substrate 202 includes only an insulator layer.

In one or more embodiments, the handle substrate and the semiconductor layer can have the same or different crystal orientation. For example, the crystal orientation of the handle substrate and/or the semiconductor layer can be {100}, {110}, or {111}. Other crystallographic orientations besides those specifically mentioned can also be used in the present application. The handle substrate and/or the semiconductor layer of the SOI substrate can be a single crystalline semiconductor material, a polycrystalline material, or an amorphous material. Typically, at least the semiconductor layer is a single crystalline semiconductor material.

The insulator layer of the SOI substrate that can be employed as substrate 110 can be a crystalline or non-crystalline oxide and/or nitride. In one embodiment, the insulator layer is an oxide such as, for example, silicon dioxide. In another embodiment, the insulator layer is a nitride such as, for example, silicon nitride or boron nitride. In yet another embodiment, the insulator layer is a multi-layered stack of, in any order, silicon dioxide and one of silicon nitride or boron nitride.

The SOI substrate can be formed utilizing standard processes including for example, SIMOX (Separation by IMplantation of OXygen) or layer transfer. When a layer transfer process is employed, an optional thinning step can follow the bonding of two semiconductor wafers together. The optional thinning step reduces the thickness of the semiconductor layer to a layer having a thickness that is more desirable.

By way of example, the thickness of the semiconductor layer of the SOI substrate can be from about 10 nm to about 100 nm. Other thicknesses that are lesser than, or greater than, the aforementioned thickness range can also be used as the thickness of the semiconductor layer of the SOI substrate. The insulator layer of the SOI substrate can have a thickness from about 1 nm to about 200 nm. Other thicknesses that are lesser than, or greater than, the aforementioned thickness range can also be employed as the insulator layer.

It should also be noted that not all masking, patterning, and lithography processes are shown, because a person of ordinary skill in the art would recognize where masking and patterning are utilized to form the identified layers and openings, and to perform the identified selective etching processes, as described herein.

Figure 4:
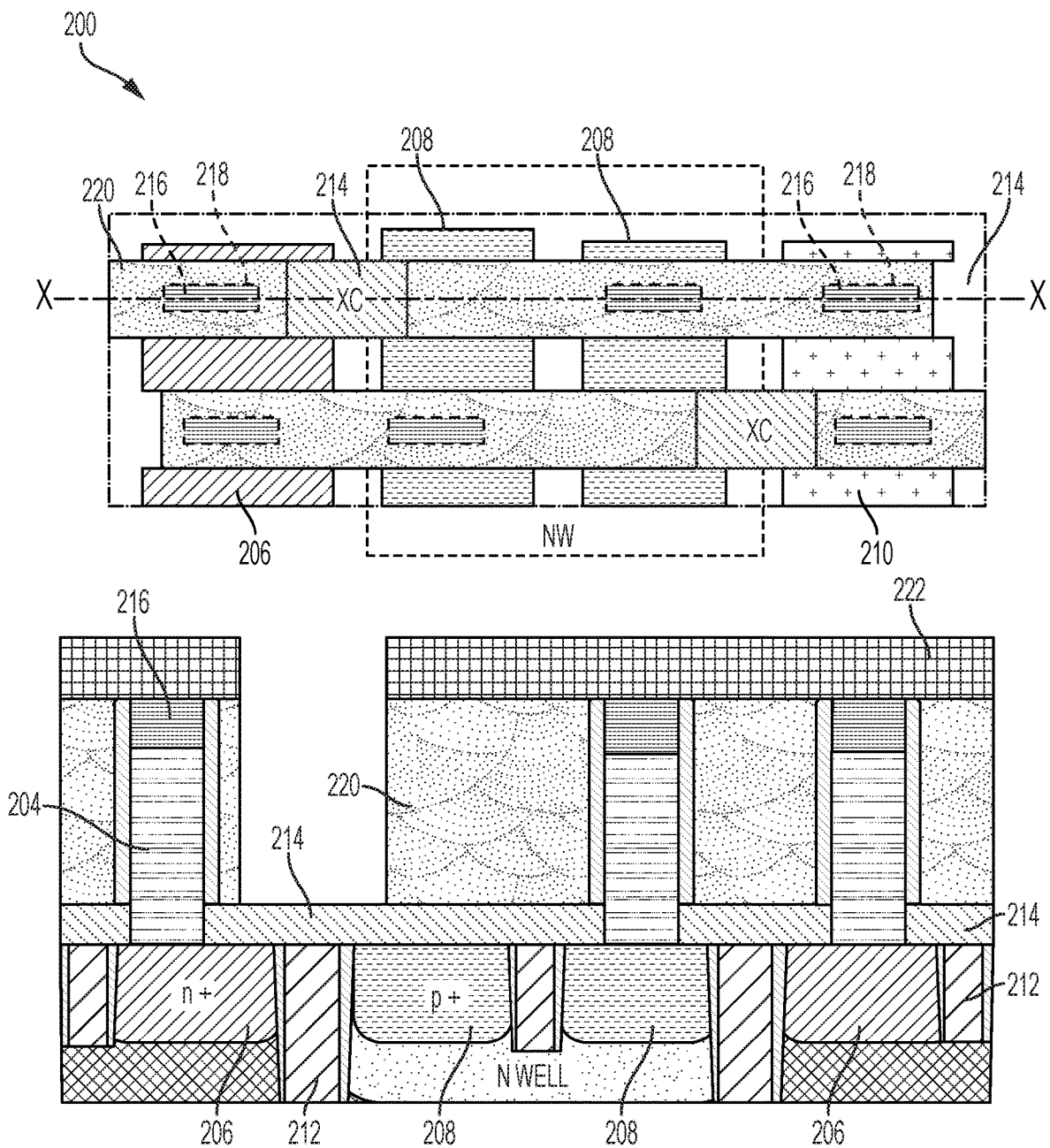
FIG. 4 shows a top down view and a cross sectional view of a semiconductor structure taken along lines X-X of the top down view after deposition and patterning of a first block mask on the dummy gate (or final gate electrode) in accordance with one or more embodiments of the present invention.

FIG. 4 illustrates a top down view and a cross sectional view taken long lines X-X of the structure depicted in FIG. 3 subsequent to deposition of a block mask 222 onto the substrate. The block mask 222 is lithographically patterned and etched to the bottom spacer layer to cut the gate electrode 220 at a location overlying the bottom S/D of pFET and nFET, which are separated by shallow trench isolation region 212.

Figure 5:
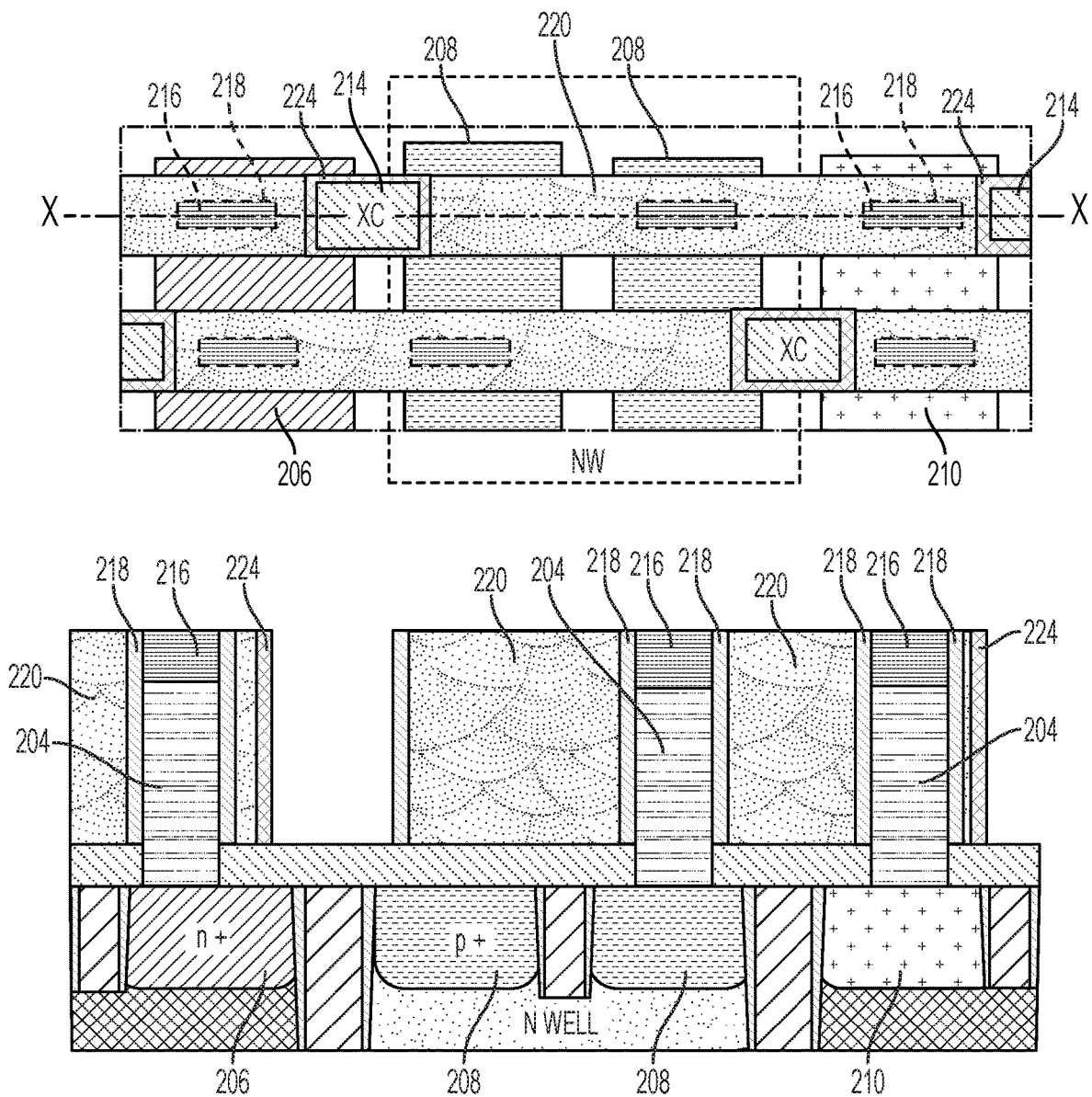
FIG. 5 shows a top down view and a cross sectional view of a semiconductor structure taken along lines X-X of the top down view after deposition of a spacer layer in accordance with one or more embodiments of the present invention.

FIG. 5 illustrates a top down view and a cross sectional view taken long lines X-X of the structure depicted in FIG. 4 subsequent to conformal deposition of a spacer layer 224 onto surfaces of the gate electrode. The spacer layer is removed from the top surface such that the space layer 224 is on sidewalls of the opening provided during gate electrode cut.

Figure 6:
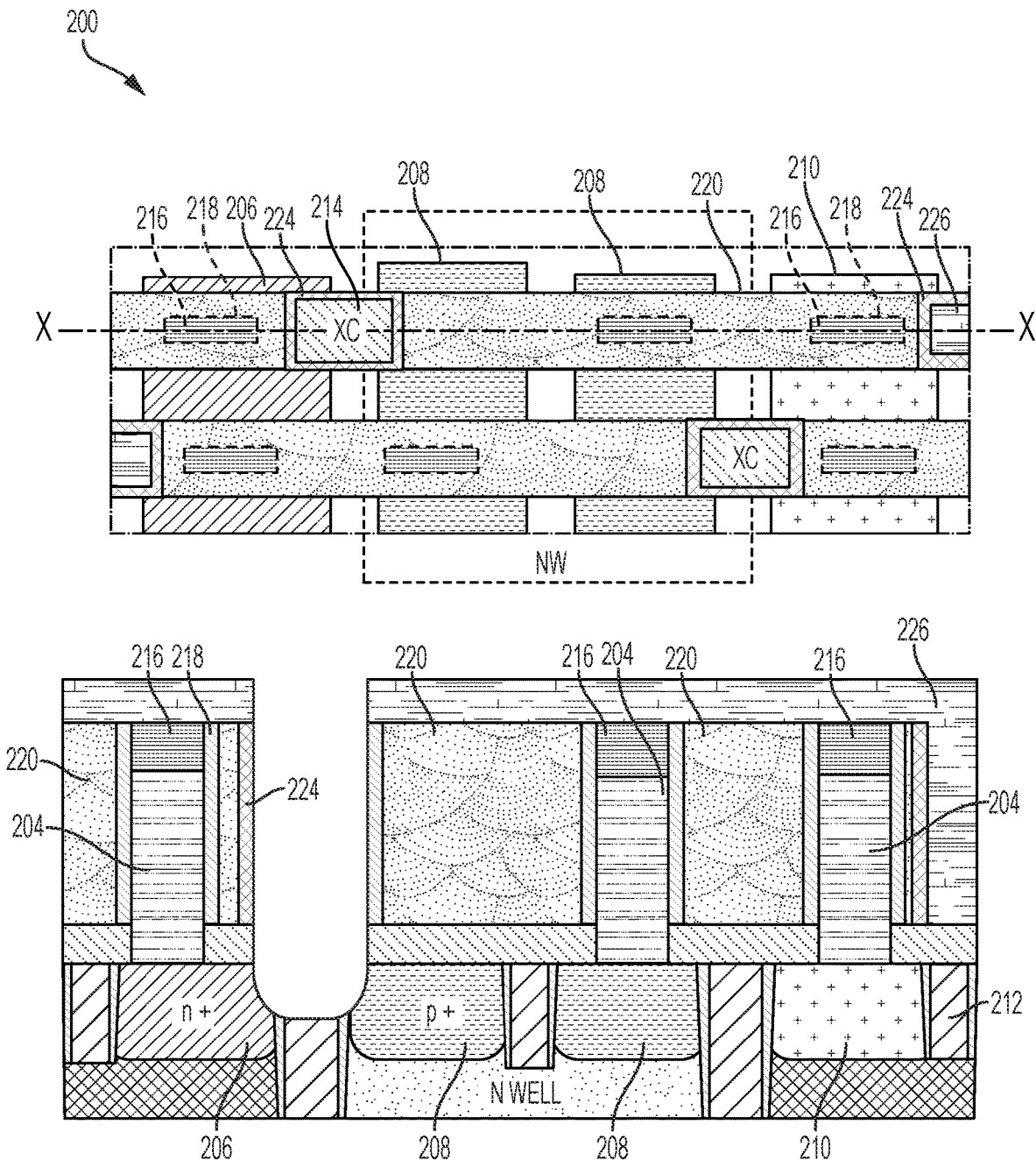
FIG. 6 shows a top down view and a cross sectional view of a semiconductor structure taken along lines X-X of the top down view after deposition and patterning of a second block mask to expose bottom source or drain regions in accordance with one or more embodiments of the present invention.

FIG. 6 illustrates a top down view and a cross sectional view taken long lines X-X of the structure depicted in FIG. 5 subsequent to refilling the openings with a block mask 226 followed by opening the bottom S/D 206, 208 of the pFET and nFET devices, respectively. It should be apparent that the top down view illustrates the structure 200 subsequent to a planarization process to remove the block mask from the horizontal surfaces, which occurs subsequent to opening the bottom S/D 206, 208. Opening can be effected by a directional etch such as reactive ion etching. The opening corresponds to the location of a local interconnect.

Figure 7:
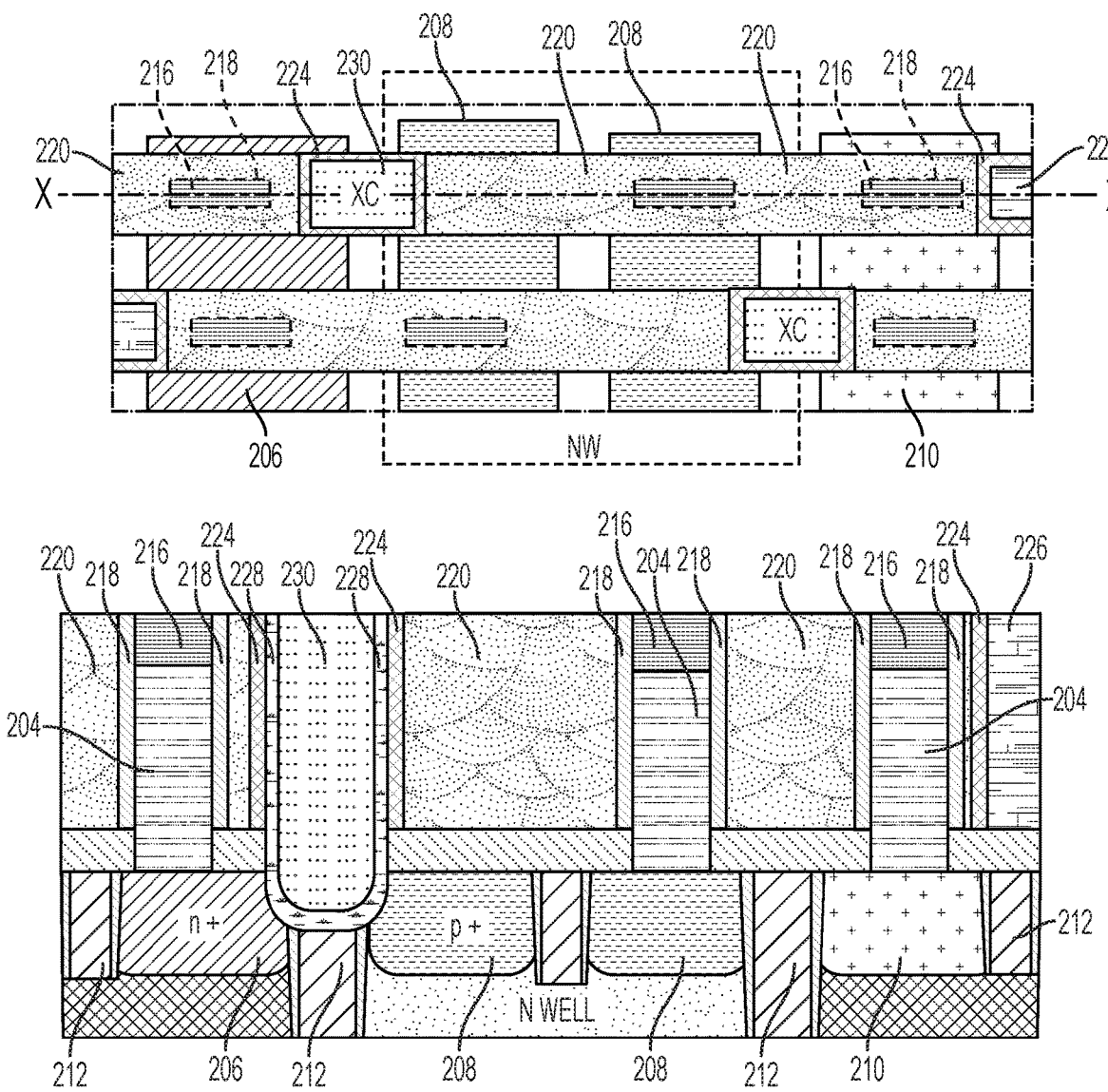
FIG. 7 shows a top down view and a cross sectional view of a semiconductor structure taken along lines X-X of the top down view after liner and metal fill deposition in accordance with one or more embodiments of the present invention.

FIG. 7 illustrates a top down view and a cross sectional view taken long lines X-X of the structure depicted in FIG. 6 subsequent to deposition of a liner layer 228 on sidewalls of the opening followed by metal fill. A typical liner layer can include tantalum, tantalum nitride, cobalt, ruthenium, titanium, titanium nitride, tungsten nitride, or combinations of more than one material (for example tantalum nitride/tantalum or tantalum nitride/cobalt). The presence of the liner layer such as titanium nitride, for example, insures that a metal such copper, which can participate in interdiffusion during subsequent annealing processes, to fabricate the structure 200 will not further diffuse. The liner layer 106 can be deposited by PVD, CVD, or ALD processes.

Next, an optional conformal seed layer (not shown) is deposited. The function of the seed layer is to provide a base upon which a metal conductor can be deposited. The seed layer can be formed by one or more methods known to those skilled in the art. For example, the seed layer can be formed by chemical vapor deposition (CVD), physical vapor deposition (PVD), or some variation of these two deposition processes. The seed layer can also be formed electrochemically or by an electroless process. In the case of PVD, the seed layer can be deposited by reactive or non-reactive sputtering from a single alloy target, or from multiple targets, by ionized sputtering.

The composition of the one or metals in the deposited seed layer is typically from 1 atomic percent to about 10 atomic percent. In some embodiments, the deposited seed layer will contain from about 1 atomic percent to about 7 atomic percent. Examples of seed layers are copper, copper manganese, and the like.

Following deposition of the seed layer, a layer of metal 230 is then deposited, which will be used to define the buried metal interconnect. The metal can be copper, but can be any suitable conductor including, but not limited to Cu, Co, Al, AlCu, Ti, TiN, Ta, TaN, W, WN, MoN, Pt, Pd, Os, Ru, $IrO_2$, $ReO_2$, $ReO_3$, alloys thereof, and mixtures thereof. In some structures, the copper metal layer can be used and can include an alloying element such as C, N, O, Cl or S, which have been shown to improve the reliability of the copper conductor. The amount of alloying element in the copper alloy is typically in the range of about 0.001 weight percent (wt. %) to about 10 wt %).

The metal layer can be formed by CVD, sputtering, electrochemical deposition or like processes. For example, the deposition of copper can proceed by electrochemical deposition such as electroplating or electroless plating.

Following formation of the metal layer, the substrate is subjected to a planarization process stopping at the hardmask 218 to remove any metal overburden (includes seed layer and liner layer removal) such that a top surface of the metal layer 230 is substantially coplanar to the top surface as shown. For example, the surface can be planarized using an electropolishing process. In an electropolishing process, small amounts of metal are etched by electroetch or electrochemical etching to provide a metal interconnect having a top metal surface generally coplanar to the top surface of the dielectric. In another embodiment, the planar surface is formed by chemical mechanical polishing (CMP). The CMP process planarizes the surface of the interconnect structure by a combination of chemical and mechanical forces using a non-selective slurry composition generally known in the art. The slurry composition contains a silica abrasive material, which removes the different metal layers at substantially the same rate. Alternatively, a planar surface can be formed by a non-selective plasma etching process.

Figure 8:
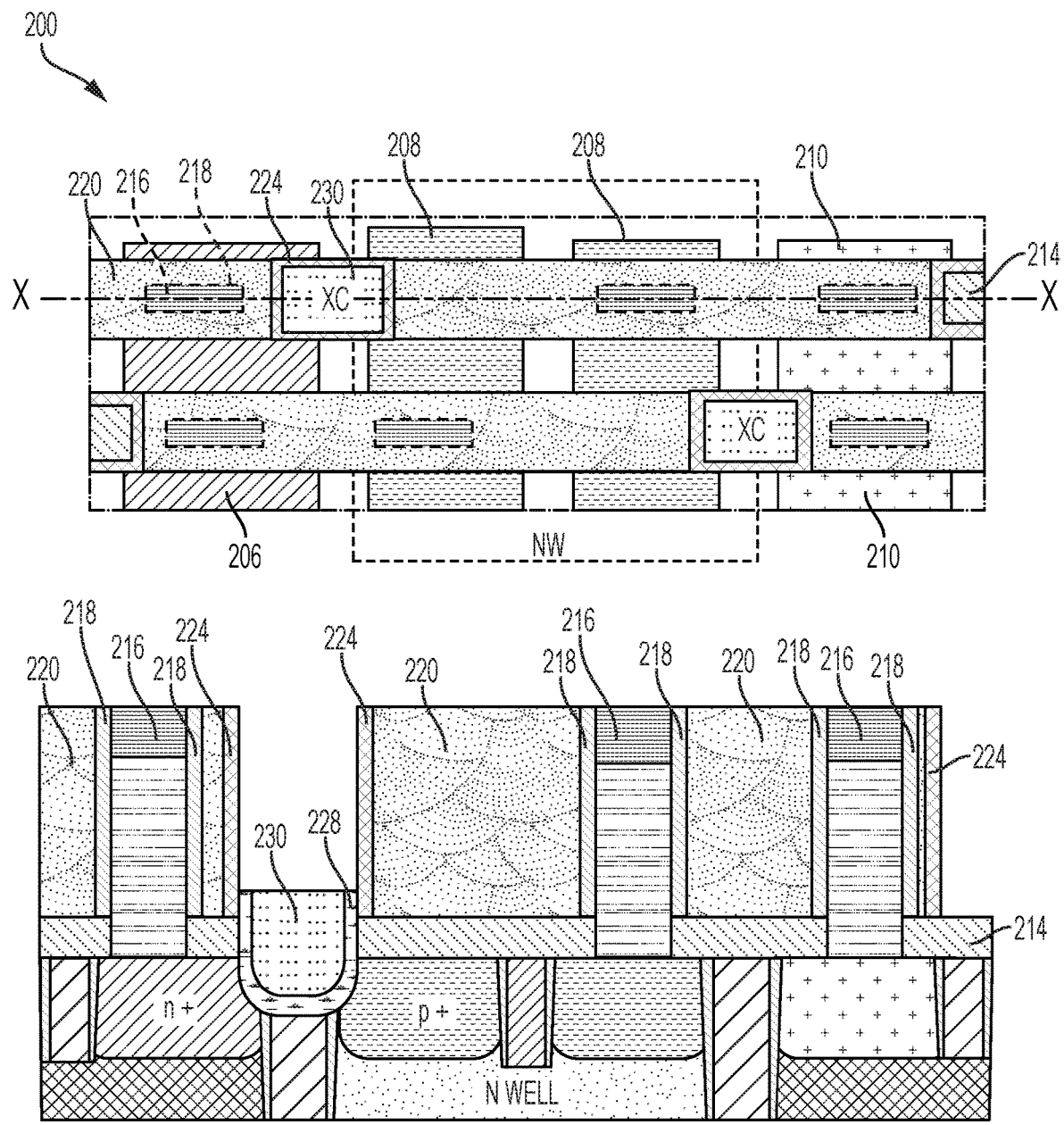
FIG. 8 shows a top down view and a cross sectional view of a semiconductor structure taken along lines X-X of the top down view after formation of a recess of the liner and metal filled opening accordance with one or more embodiments of the present invention.

FIG. 8 illustrates a top down view and a cross sectional view taken long lines X-X of the structure depicted in FIG. 7 subsequent to recessing the metal to a target thickness and then stripping the block mask 226 in other cut areas that are not utilized to form a buried local interconnect. Recessing the metal can be effected using a wet or dry etching process.

Figure 9:
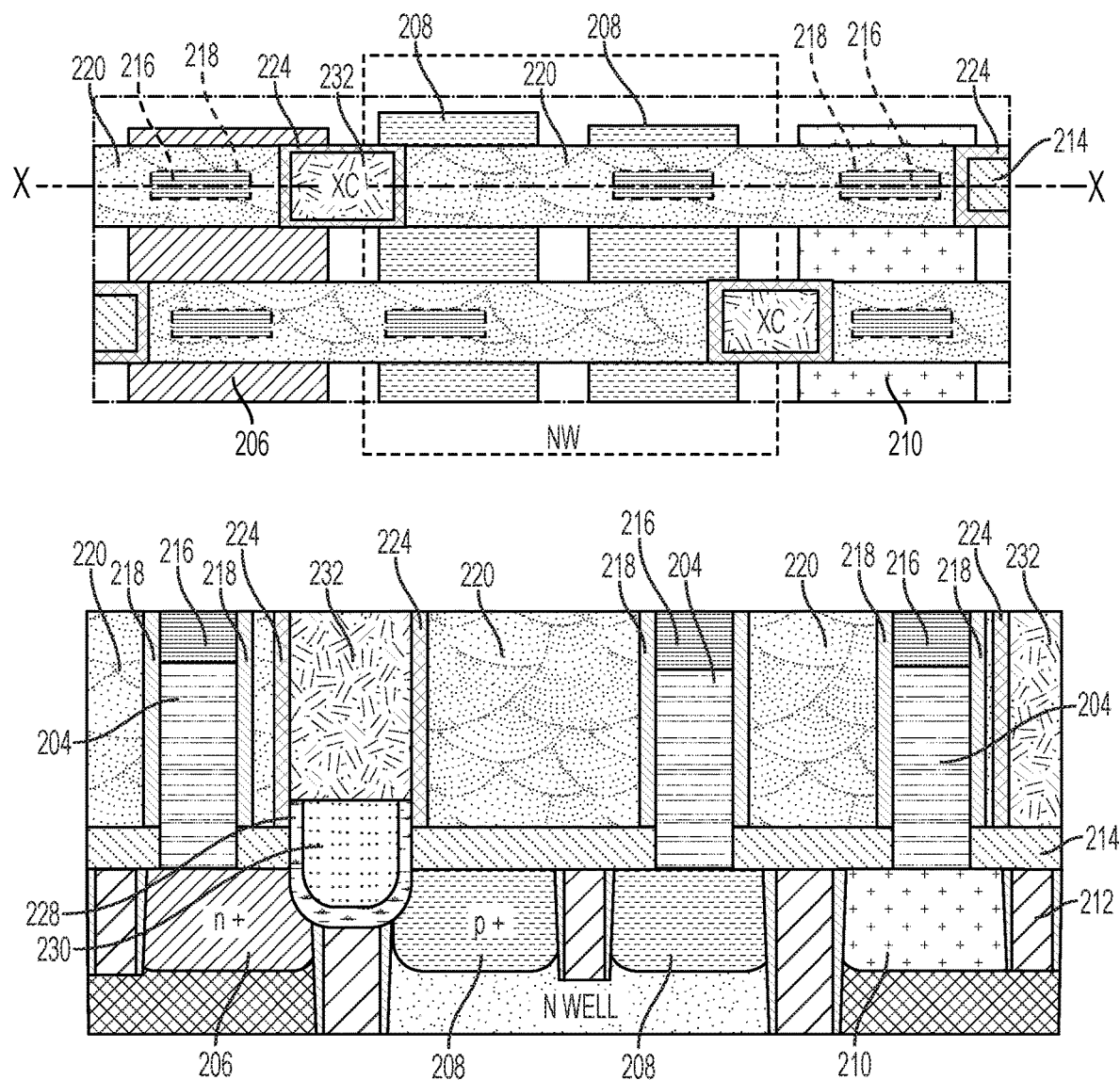
FIG. 9 shows a top down view and a cross sectional view of a semiconductor structure taken along lines X-X of the top down view after deposition of an oxide in the recess in accordance with one or more embodiments of the present invention.

FIG. 9 illustrates a top down view and a cross sectional view taken long lines X-X of the structure depicted in FIG. 7 subsequent to filling the recess with an oxide 232 followed by a planarization process stopping on the hardmask 218, thereby forming a buried local interconnect between the pFET and nFET.

From here, methods known in the art are used to complete the fabrication of the devices as shown in FIG. 2, such as pulling the hardmask 218 and epitaxial formation of a top S/D on the fins 204, formation of contacts, deposition of interlayer dielectric layers, metal layers, and other back end-of-line (BEOL) steps and packaging.

Although specific reference has been made to vertical field effect transistors wherein the fins are vertically oriented relative to the substrate plane, the process for forming the self-aligned buried local interconnect can be applied to vertical field effect transistors, fin type field effect transistors, nanosheet field effect transistors, field effect transistors formed on SOI substrates, or the like so as to maximize circuit density.

The terms "about," "substantially," "approximately," and variations thereof, are intended to include the degree of error associated with measurement of the particular quantity based upon the equipment available at the time of filing the application. For example, "about" can include a range of ±8% or 5%, or 2% of a given value.

The descriptions of the various embodiments of the present invention have been presented for purposes of illustration, but are not intended to be exhaustive or limited to the embodiments described herein. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments described herein.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form described. Many modifications and variations will be apparent to those of ordinary skill in the art without departing from the scope and spirit of the invention. The embodiment was chosen and described in order to best explain the principles of the inventive teachings and the practical application, and to enable others of ordinary skill in the art to understand the invention for various embodiments with various modifications as are suited to the particular use contemplated.

The diagrams depicted herein are just one example. There may be many variations to this diagram or the operations described therein without departing from the spirit of the invention. For instance, the operations may be performed in a differing order or operations may be added, deleted or modified. All of these variations are considered a part of the claimed invention.

While various embodiments have been described, it will be understood that those skilled in the art, both now and in the future, may make various modifications which fall within the scope of the claims which follow. These claims should be construed to maintain the proper protection for the invention first described.

What is claimed is:

1. A method of forming a buried local interconnect electrically connecting a p-type doped field effect transistor (pFET) to an n-type doped field effect transistor (nFET), the method comprising:
    providing an initial structure on a substrate comprising a vertically oriented fin coupled to a n-type doped bottom source or drain (S/D) electrically isolated from a vertically oriented fin coupled to a p-type doped bottom S/D, wherein each of the vertically oriented fins comprise a hardmask on a top surface thereof, a high k dielectric layer on sidewalls of each fin and a gate electrode adjacent the vertically oriented fins;
    depositing a first block mask onto the initial structure and lithographically patterning and etching the first block mask and the gate electrode to a bottom spacer layer to cut the gate electrode and form a first opening therein;
    selectively depositing a spacer layer on sidewalls of the gate electrode defining the first opening;
    depositing a second block mask and lithographically patterning and etching the second block mask through the bottom spacer layer to form a second opening at the cut gate electrode exposing the n-typed doped bottom S/D and an adjacent p-type doped bottom S/D;
    depositing a metal liner and a metal into the second opening and on the exposed n-type doped bottom S/D and the adjacent p-type doped bottom S/D;
    recessing the metal liner and the metal to a target thickness;
    stripping the second block mask; and
    depositing an oxide to fill the second opening such that the oxide has a coplanar top surface to form the self-aligned buried local interconnect electrically coupling the n-typed doped bottom S/D and the adjacent p-type doped bottom S/D.

2. The method of claim 1, wherein depositing the metal liner and the metal into the opening and on the exposed n-type doped bottom S/D and the adjacent p-type doped bottom S/D comprises planarizing the substrate to the hardmask so as to remove overburden of the metal liner and the metal.

3. The method of claim 1, wherein the hardmask comprises silicon nitride.

4. The method of claim 1, wherein etching the first block mask and the gate electrode to the bottom spacer layer to cut the gate electrode and form the first opening therein comprises a reactive ion etch process.

5. The method of claim 1, wherein stripping the second block mask comprises removing the second block mask from other gate electrode cut locations.

6. The method of claim 1 further comprising selectively removing the hardmask and epitaxially growing and doping a top S/D on each of the fins.

7. The method of claim 1, wherein the self-aligned buried local interconnect comprises copper, cobalt, aluminum, aluminum-copper, titanium, titanium nitride, tantalum, tantalum nitride, tungsten, tungsten nitride, molybdenum nitride, platinum, palladium, osmium, ruthenium, iridium oxide, rhenium oxide, alloys thereof, or mixtures thereof.

8. The method of claim 1, wherein the gate electrode comprises tungsten, titanium, tantalum, ruthenium, hafnium, zirconium, cobalt, nickel, copper, aluminum, platinum, tin, silver, gold, tantalum nitride, titanium nitride, tantalum carbide, titanium carbide, titanium aluminum carbide, tungsten silicide, tungsten nitride, ruthenium oxide, cobalt silicide, nickel silicide, transition metal aluminides, carbon nanotube, conductive carbon, graphene, or combinations thereof.

9. A method of forming an interconnect electrically connecting field effect transistors, the method comprising:
    forming at least a first semiconductor body for a first field effect transistor and a second semiconductor body for a second field effect transistor, wherein the first semiconductor body and the second semiconductor body are separated by an isolation region, wherein the first field effect transistor and the second field effect transistor are different types;
    forming an elongated gate electrode that traverses the first semiconductor body and the second semiconductor body;
    forming an opening in the elongated gate electrode between the first semiconductor body and the second semiconductor body to define a first segment of the gate electrode and a second segment of the gate electrode; and
    forming a buried metal interconnect between the first semiconductor body and the second interconnect body, wherein the buried metal interconnect electrically couples the first field effect transistor to the second field effect transistor, wherein forming the buried metal interconnect comprises:

depositing a spacer layer on sidewalls of the gate electrode defining the opening;

filling the opening with a metal liner layer and a metal;

recessing the metal liner layer and the metal to a target thickness; and filling the recessed metal liner layer with an oxide.

10. The method of claim 9, wherein the first field effect transistor is a p-type doped field effect transistor (pFET) and the second field effect transistor is an n-type doped field effect transistor (nFET).

11. The method of claim 9, wherein the first and second field effect transistors comprise vertical fin field effect transistors.

12. The method of claim 9, wherein the gate electrode is a dummy gate electrode comprising polysilicon.

13. The method of claim 9, wherein forming the opening in the elongated gate electrode between the first semiconductor body and the second semiconductor body comprises a directional etching process to expose a bottom source or drain region in the first semiconductor body and a bottom source or drain region in the second semiconductor body.

\* \* \* \* \*